(12) United States Patent
Tsai et al.

(10) Patent No.: US 8,149,047 B2
(45) Date of Patent: Apr. 3, 2012

(54) BANDGAP REFERENCE CIRCUIT WITH LOW OPERATING VOLTAGE

(75) Inventors: Hung-Chieh Tsai, Tainan Hsien (TW); Yu-Hsin Lin, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/051,989

(22) Filed: Mar. 20, 2008

(65) Prior Publication Data
US 2009/0237150 A1    Sep. 24, 2009

(51) Int. Cl.
*G05F 3/02* (2006.01)
(52) U.S. Cl. .................................................. 327/539
(58) Field of Classification Search .......................... None
See application file for complete search history.

(56) References Cited

U.S. PATENT DOCUMENTS

| | | | | |
|---|---|---|---|---|
| 4,689,607 A * | 8/1987 | Robinson | | 341/135 |
| 5,811,993 A * | 9/1998 | Dennard et al. | | 327/54 |
| 5,821,776 A * | 10/1998 | McGowan | | 326/41 |
| 6,411,158 B1 * | 6/2002 | Essig | | 327/539 |
| 7,061,322 B2 | 6/2006 | Heightley | | |
| 7,112,998 B2 * | 9/2006 | Ajit | | 326/81 |
| 7,116,181 B2 * | 10/2006 | Bakker | | 331/111 |
| 7,349,190 B1 * | 3/2008 | Maheedhar et al. | | 361/92 |
| 7,489,193 B2 | 2/2009 | Adachi | | |
| 7,514,987 B2 * | 4/2009 | Lin | | 327/539 |
| 2002/0008562 A1 * | 1/2002 | Kokubun et al. | | 327/307 |
| 2002/0036489 A1 * | 3/2002 | Cocetta | | 323/313 |
| 2003/0058031 A1 * | 3/2003 | Scoones | | 327/539 |
| 2005/0040803 A1 | 2/2005 | Ueda | | |
| 2007/0109037 A1 * | 5/2007 | Lin | | 327/539 |
| 2008/0169866 A1 * | 7/2008 | Kleveland et al. | | 327/539 |
| 2009/0085549 A1 * | 4/2009 | Sengupta et al. | | 323/313 |

FOREIGN PATENT DOCUMENTS

CN          1713520          12/2005

OTHER PUBLICATIONS

English language translation of abstract of CN 1713520 (published Dec. 28, 2005).

* cited by examiner

*Primary Examiner* — Lincoln Donovan
*Assistant Examiner* — Khareem E Almo
(74) *Attorney, Agent, or Firm* — Thomas|Kayden (57) ABSTRACT

A bandgap reference circuit comprising a current mirror, an operational amplifier, first and second BJT transistors is disclosed. The current mirror comprises a first input terminal, a second input terminal and at least one output terminal. The operational amplifier is coupled to the current mirror, wherein a first transistor and a second transistor respectively coupled to the first and the second input terminals have a zero or near zero threshold voltage. The first and second BJT transistors are coupled to two input terminals of the operational amplifier respectively, wherein at least one of the first and second BJT transistors is coupled to the output terminal of the current mirror through a conductive path.

6 Claims, 8 Drawing Sheets

BANDGAP REFERENCE CIRCUIT WITH LOW OPERATING VOLTAGE

BACKGROUND OF THE INVENTION

1. Field of the Invention

The invention relates to a bandgap reference circuit, and more particularly to a bandgap reference circuit with low operating voltage.

2. Description of the Related Art

Reference voltage is typically required to provide a substantially constant output voltage despite gradual or momentary changes in input voltage, output current or temperature. In particular, many designers have utilized bandgap reference circuits due to their ability to provide a stable voltage supply that is insensitive to temperature variations over a wide temperature range. These bandgap references rely on certain temperature-dependent characteristics of the base-emitter voltage of a transistor. Bandgap reference circuits typically operate on the principle of compensating the negative temperature coefficient of a base-emitter voltage of a bipolar transistor with the positive temperature coefficient of the thermal voltage. In general cases, the temperature-independent voltage is around 1.25V, and if the system cannot provide sufficient voltage, the bandgap reference circuit may cause errors or fail to operate, i.e. based on the present architecture of bandgap reference circuits, the bandgap reference circuit cannot operate at a voltage 1.2V or lower.

BRIEF SUMMARY OF THE INVENTION

The invention provides an operational amplifier comprising a first NMOS transistor, a second NMOS transistor, a third PMOS transistor, a fourth PMOS transistor and a fifth NMOS transistor. The first NMOS transistor has zero or near zero threshold voltage, a first gate for receiving a first input signal, a first source, and a first drain. The second NMOS transistor has zero or near zero threshold voltage, a second gate for receiving a second input signal, a second source, and a second drain. The third PMOS transistor has a third gate, a third source, and a third drain, wherein the third source is coupled to a high voltage source, and the third gate and the third drain are coupled to the first drain. The fourth PMOS transistor has a fourth gate, a fourth source, and a fourth drain, wherein the fourth source is coupled to the high voltage source, and the fourth gate is coupled to the first drain and the fourth drain is coupled to the second drain. The fifth NMOS transistor has a fifth gate, a fifth source, and a fifth drain, wherein the fifth gate receives a bias voltage, the fifth drain is coupled to the first source and the second source, and the fifth source is grounded.

The invention further provides an operational amplifier comprising a first PMOS transistor, a second PMOS transistor, a third NMOS transistor, a fourth NMOS transistor and a fifth PMOS transistor. The first PMOS transistor has zero or near zero threshold voltage, a first gate for receiving a first input signal, a first source, and a first drain. The second PMOS transistor has zero or near zero threshold voltage, a second gate for receiving a second input signal, a second source, and a second drain. The third NMOS transistor has a third gate, a third source, and a third drain, wherein the third source is grounded, the third gate and the third drain are coupled to the first drain. The fourth NMOS transistor has a fourth gate, a fourth source, and a fourth drain, wherein the fourth source is grounded, and the fourth gate is coupled to the first drain and the fourth drain is coupled to the second drain. The fifth PMOS transistor has a fifth gate, a fifth source, and a fifth drain, wherein the fifth gate receives a bias voltage, the fifth drain is coupled to the first source and the second source, and the fifth source is coupled to a high voltage source.

The invention further provides a temperature-independent system comprising a positive temperature coefficient compensation unit, a negative temperature coefficient compensation unit, and an operational amplifier. The positive temperature coefficient compensation unit has a positive temperature coefficient $k_1$ and outputs a first voltage $V_1$. The negative temperature coefficient compensation unit has a negative temperature coefficient $k_2$ and outputs a second voltage $V_2$, wherein $\alpha_1$ and $\alpha_2$ satisfy a first equation: $\alpha_1 k_1 + \alpha_2 k_2 = 0$. The operational amplifier has a first input terminal receiving the first voltage, a second input terminal receiving the second voltage and an output terminal outputting an output voltage Vo, wherein a first NMOS transistor and a second NMOS transistor respectively coupled to the first and the second input terminals have zero or near zero threshold voltage, and the output voltage Vo satisfies a second equation: $Vo = \alpha_1 V_1 + \alpha_2 V_2$.

The invention further provides a bandgap reference circuit comprising an operational amplifier, a first resistor, a second resistor, a third resistor, a first bipolar transistor, and a second bipolar transistor. The operational amplifier has a first input terminal, a second input terminal receiving the second voltage and an output terminal, wherein a first transistor and a second transistor respectively coupled to the first and the second input terminals have zero or near zero threshold voltage. The first resistor has a first terminal coupled to the output terminal, and a second terminal coupled to the first input terminal. The second resistor has a third terminal coupled to the output terminal, and a fourth terminal coupled to the second input terminal. The third resistor has a fifth terminal coupled to the second input terminal, and a sixth terminal. The first bipolar transistor has a first base, a first collector, and a first emitter, wherein the first base and the first collector are coupled to the first input terminal, and the first emitter is grounded. The second bipolar transistor has a second base, a second collector, and a second emitter, wherein the second base and the second collector are coupled to the sixth terminal, and the second emitter is grounded.

The invention further provides a bandgap reference circuit comprising a current mirror, an operational amplifier, first and second BJT transistors. The current mirror comprises a first input terminal, a second input terminal and at least one output terminal. The operational amplifier is coupled to the current mirror, wherein a first transistor and a second transistor respectively coupled to the first and the second input terminals have zero or near zero threshold voltage. The first and second BJT transistors are coupled to two input terminals of the operational amplifier respectively, wherein at least one of the first and second BJT transistors is coupled to the output terminal of the current mirror through a conductive path.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
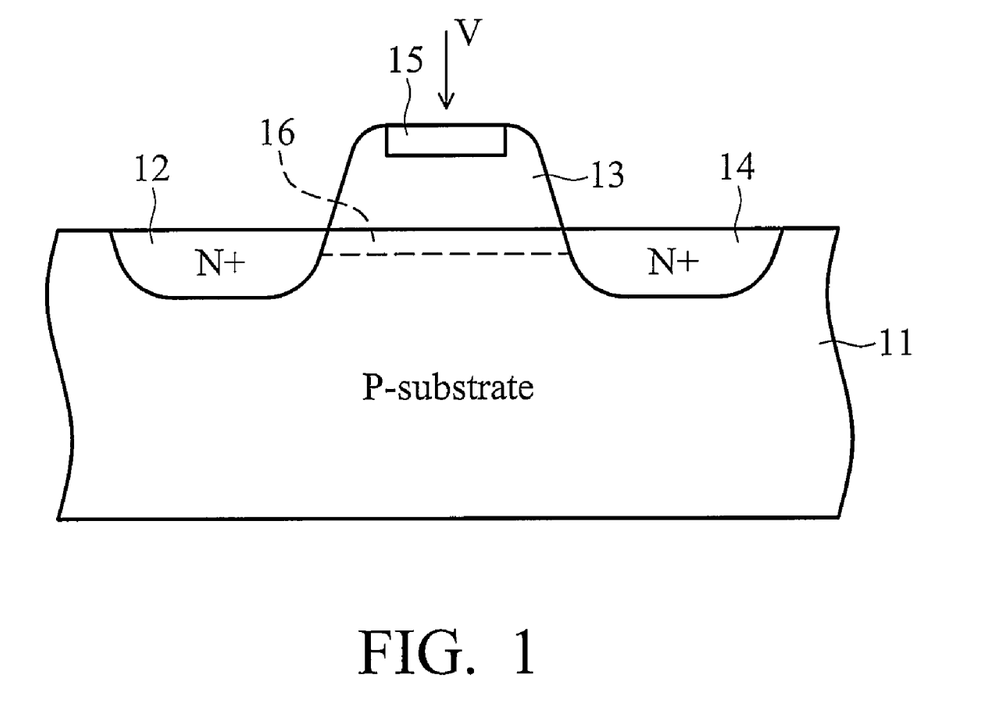
FIG. 1 is a cross section diagram of a native NMOS transistor.

FIG. 1 is a cross section diagram of a native NMOS transistor. A gate structure 13 formed on the P-substrate 11 and a conductive metal area 15 is disposed on the gate structure 13 for receiving a bias voltage V. Two N-type doped regions 12 and 14 are formed in P-substrate 11 to form the source and drain of the native NMOS transistor. When the bias voltage V is applied on the gate structure 13, a channel 16 formed beneath the gate structure 13. In the native NMOS transistor shown in FIG. 1, the amount of the bias voltage V is extremely small, and can even be brought to zero, by adequate semiconductor process.

Figure 2:
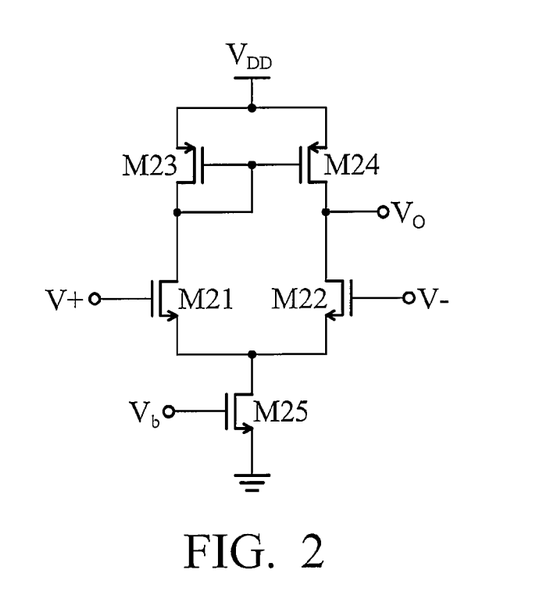
FIG. 2 is a circuit diagram of an embodiment of an NMOS-input-based operational amplifier.

FIG. 2 is a circuit diagram of an embodiment of an NMOS-input-based operational amplifier. PMOS transistor M23 has a source coupled to a high voltage source VDD, a drain and a gate coupled to the drain. PMOS transistor M24 has a source coupled to the high voltage source VDD, a gate coupled to the gate of the PMOS transistor M23, and a drain coupled to an output voltage Vo. NMOS transistor M21 has a gate receiving a first input voltage V+, a drain coupled to the drain of the PMOS transistor M23, and a source. NMOS transistor M22 has a gate receiving a second input voltage V−, a drain coupled to the drain of the PMOS transistor M24, and a source coupled to the source of the NMOS transistor M21. NMOS transistor M25 has a gate receiving a bias voltage $V_b$, a drain coupled to the source of the NMOS transistor M21, and a source grounded. In this embodiment, the threshold voltages of the NMOS transistors M21 and M22 are zero, however, positive or negative threshold voltages near zero also apply. The term "near zero threshold voltage" herein may be, for example, a threshold voltage between −0.2V∼+0.2V. In order to prevent the NMOS transistor M25 from entering the linear region, the saturation voltage of NMOS transistor M25 satisfies the equation:

$$Vds_{M25} > Vgs_{M25} - Vt_{M25}$$

$$=> Vd_{M25} > Vg_{M25} - Vt_{M25}$$

Furthermore, in order to ensure that the NMOS transistor M21 is activated, the input voltage V+ satisfies the equation:

$$V+ > Vd_{M25} + Vt_{M21}$$

Since the threshold voltage of the NMOS transistor M21 is zero, thus, when the input voltage V+ is larger than $Vd_{M25}$, the NMOS transistor M21 is activated.

In order to ensure that the NMOS transistor M21 is at the saturation region, the saturation voltage of NMOS transistor M21 satisfies the equation:

$$Vd_{M21} > V+$$

Since the $Vd_{M21}$ is equal to $Vg_{M23}$, we can rewrite the equation as the following:

$$Vg_{M23} > V+$$

The high voltage source VDD provides the operating voltage to the operational amplifier shown in FIG. 2, and satisfies the equation:

$$VDD > Vg_{M23} + Vt_{M23}$$

In brief, the operating voltage of the operational amplifier shown in FIG. 2 can be reduced due to the zero threshold voltage of NMOS transistors M21 and M22.

Figure 3:
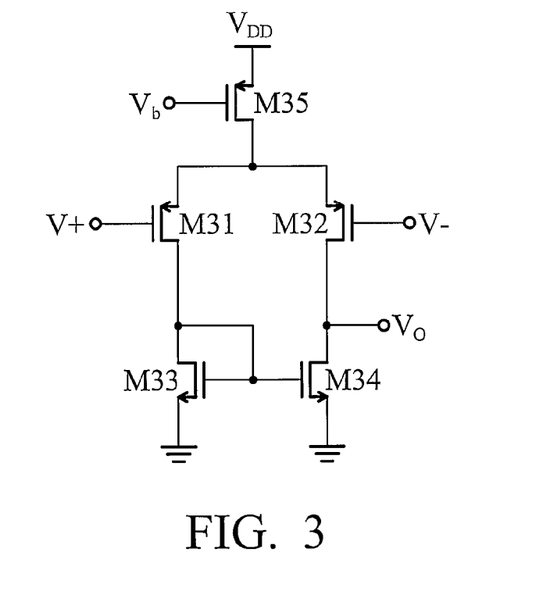
FIG. 3 is a circuit diagram of an embodiment of a PMOS-input-based operational amplifier.

FIG. 3 is a circuit diagram of an embodiment of a PMOS-input-based operational amplifier. PMOS transistor M35 has a source coupled to a high voltage source VDD, a gate receiving a bias voltage $V_b$, and a drain. PMOS transistor M31 has a source coupled to the drain of the PMOS transistor M35, a gate receiving a first input voltage, and a drain. PMOS transistor M32 has a source coupled to the drain of the PMOS transistor M35, a gate receiving a second input voltage, and a drain coupled to an output voltage Vo. NMOS transistor M33 has a source grounded, a gate, and a drain, wherein the gate and the drain are coupled to the drain of the PMOS transistor M31. NMOS transistor M34 has a source grounded, a gate coupled to the gate of the NMOS transistor M33, and a drain coupled to the drain of the PMOS transistor M32. In this embodiment, the threshold voltages of the PMOS transistors M31 and M32 may be zero, and the operating voltage of the operational amplifier shown in FIG. 3 can be reduced due to the zero threshold voltage of PMOS transistors M31 and M32. The related description and derivation can be referred in the statement of FIG. 2.

Figure 4:
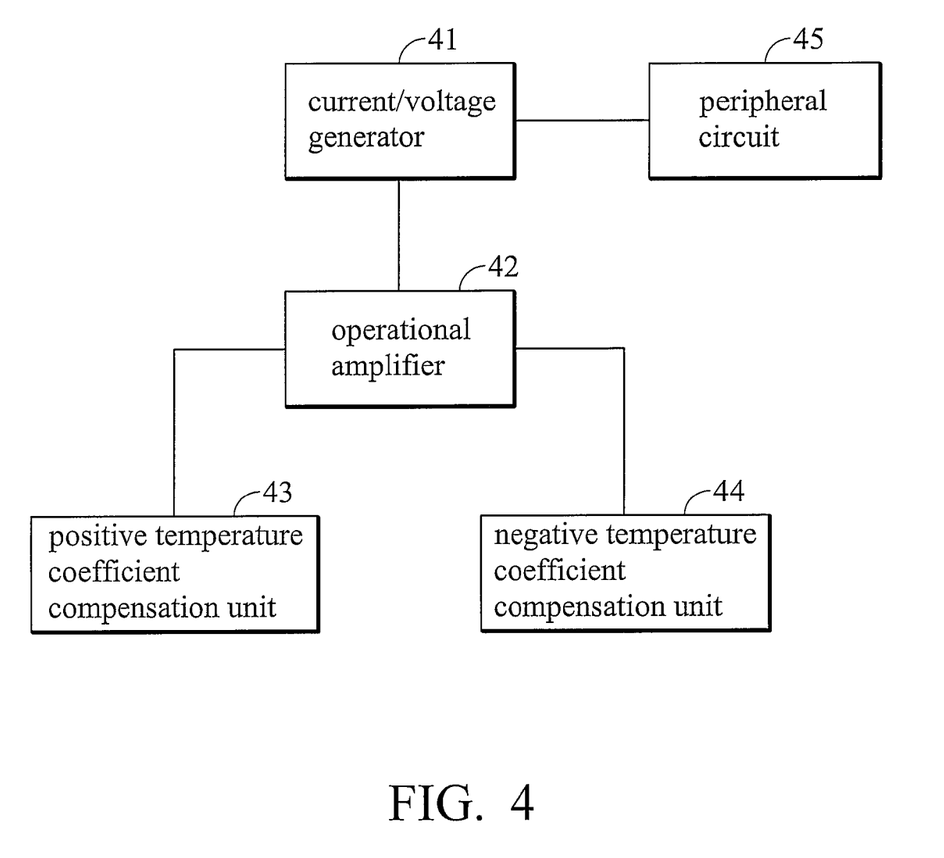
FIG. 4 is a block diagram of an embodiment of a temperature-independent system.

FIG. 4 is a block diagram of an embodiment of a temperature-independent system. The operational amplifier 42 has two input terminal receiving input voltages from the positive temperature coefficient compensation unit 43 and the negative temperature coefficient compensation unit 44. The voltage from the positive temperature coefficient compensation unit 43 carries a positive temperature coefficient and the voltage from the negative temperature coefficient compensation unit 44 carries a negative temperature coefficient. The operational amplifier 42 utilizes an external circuit to eliminate the temperature coefficient based on the ratio of positive temperature coefficient to the negative temperature. In this embodiment, the transistors in the operational amplifier 42 for receiving input voltages have zero or near zero threshold voltages. The operational amplifier 42 outputs a temperature-independent voltage to the current/voltage generator 41. The current/voltage generator 41 generates at least one desired voltage/current to the peripheral circuit 45.

Figure 5:
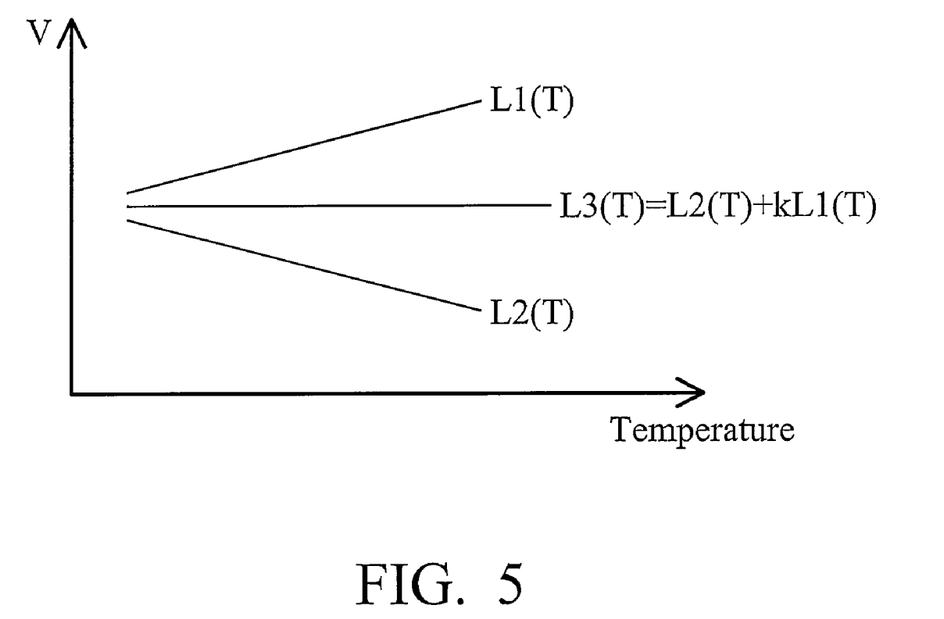
FIG. 5 shows a method for obtaining a temperature-independent voltage.

FIG. 5 shows a method for obtaining a temperature-independent voltage. L1(T) provides a voltage with a positive temperature coefficient, L2(T) provides a voltage with a negative temperature coefficient, and L3(T) is a combination of L1(T) and L2(T) for providing a temperature-independent voltage. L3(T) can be expressed as: L3(T)=L2(T)+kL1(T). We can adjust the value of k to eliminate the temperature coefficient, where k is based on the ratio of positive temperature coefficient to the negative temperature.

The base-emitter voltage of a bipolar transistor exhibits a negative temperature coefficient (TC). For a bipolar transistor, we can write $Ic = Is * \exp^{(V_{BE}/V_T)}$, where $V_T = kT/q$. The saturation current Is is proportional to $\mu k T n_i^2$, wherein $\mu$ is the mobility of minority carriers and $n_i$ is the intrinsic minority carrier concentration of silicon. The parameter $\mu$ depends on the temperature, and the quantity is represented as $\mu \propto \mu_0 T^m$, wherein m≈−3/2. The parameter $n_i$ also depends on the temperature, and the quantity is represented as $n_i^2 \propto T^3 e^{-E_g/kt}$, where $E_g \approx 1.12$ eV is the bandgap energy of silicon. Thus, we can rewrite the saturation current Is as the following $$Is = bT^{4+m}e^{-E_g/kT} \quad (1)$$

where b is a proportionality factor. Writing $V_{BE}=V_T \ln(I_C/I_s)$, we can compute the temperature coefficient of base-emitter voltage. Taking the derivative of $V_{BE}$ with respect to T, we can obtain the equation:

$$\frac{\partial V_{BE}}{\partial T} = \frac{\partial V_T}{\partial T} \ln \frac{I_C}{I_s} - \frac{V_T}{I_s} \frac{\partial I_s}{\partial T} \quad (2)$$

From (1), we obtain $$\frac{V_T}{I_s}\frac{\partial I_s}{\partial T} = (4+m)\frac{V_T}{T} + \frac{E_g}{kT^2}V_T \quad (3)$$

With (1) and (3), we can write $$\frac{\partial V_{BE}}{\partial T} = \frac{V_{BE} - (4+m)V_T - E_g/q}{T} \quad (4)$$

Equation (4) provides the temperature coefficient of the base-emitter voltage at a given temperature. With $V_{BE}=750$ mV and $$T = 300°K., \frac{\partial V_{BE}}{\partial T} = -1.5 \, \text{mV}/°K.$$

Figure 6:
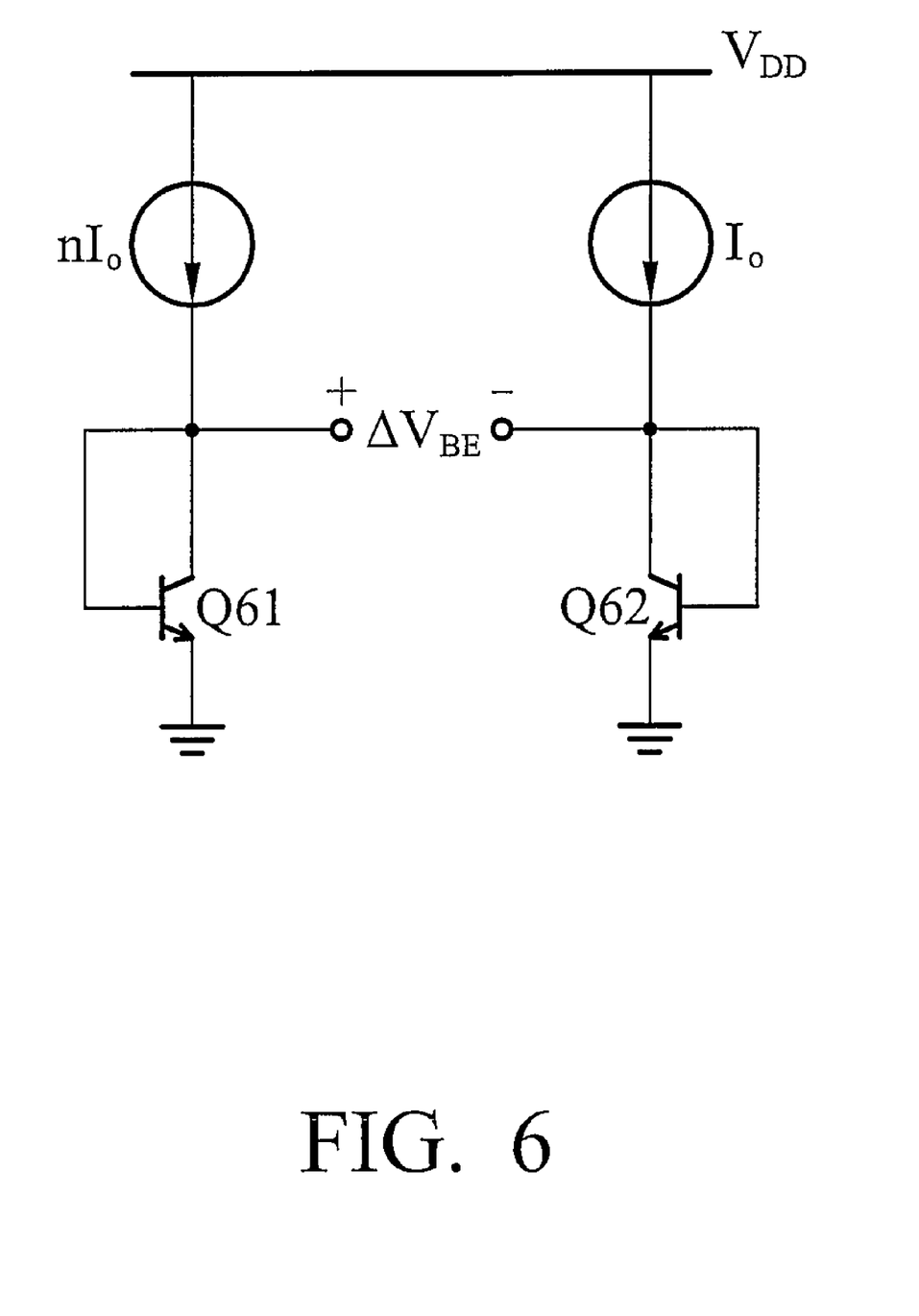
FIG. 6 is a circuit diagram of an embodiment of a proportional-to-absolute-temperature voltage generator.

To explain the positive temperature coefficient, please refer to FIG. 6. FIG. 6 is a circuit diagram of an embodiment of a proportional-to-absolute-temperature (PTAT) voltage generator. In FIG. 6, two identical transistors Q61 and Q62 ($Is_{Q61}=Is_{Q62}$) are biased at collector current of nIo and Io and their base current are negligible, then $$\Delta V_{BE} = V_{BE1} - V_{BE2}$$
$$= V_T \ln \frac{nIo}{I_{S1}} - V_T \ln \frac{Io}{I_{S2}}$$
$$= VT \ln n$$

Thus, the $V_{BE}$ difference exhibits a positive temperature coefficient:

$$\frac{\partial \Delta V_{BE}}{\partial T} = \frac{k}{q}\ln n$$

Voltages with negative and positive TCs are described, and if we want to obtain a temperature-independent voltage, we can use one voltage with positive TC and one voltage with negative TC and eliminate the temperature coefficient, as is shown in FIG. 5.

Figure 7:
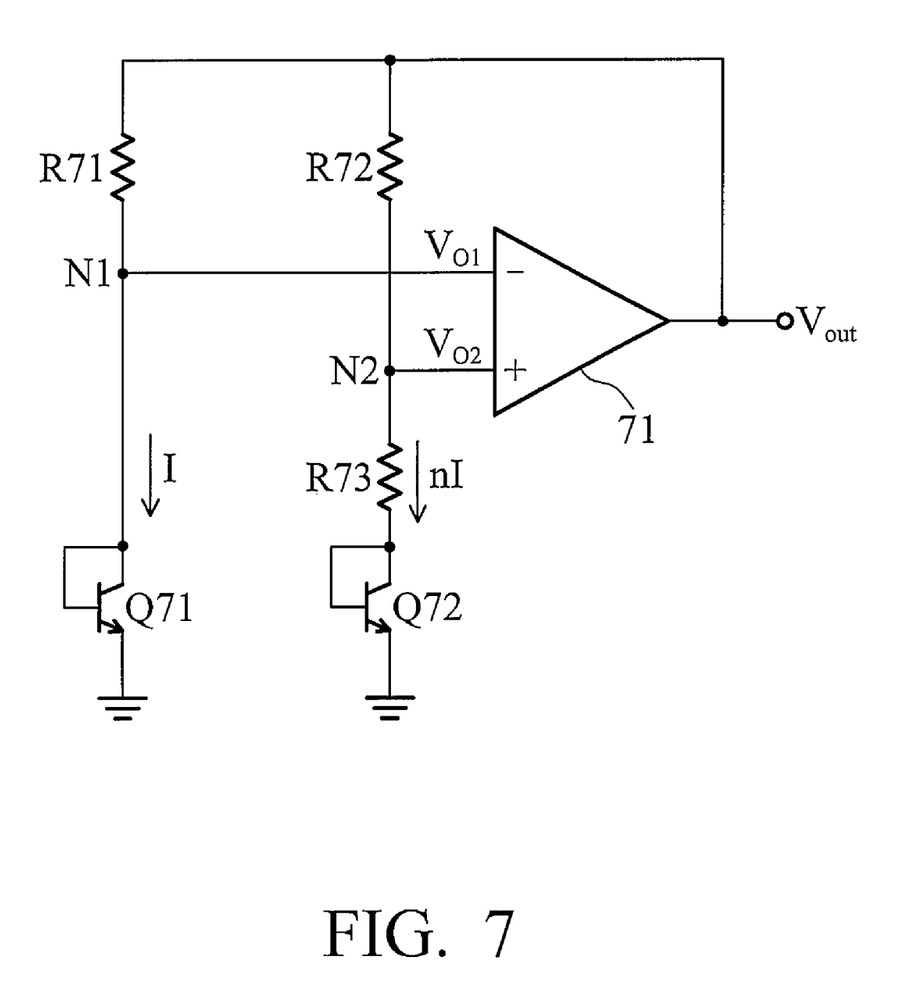
FIG. 7 is a circuit diagram of an embodiment of a bandgap reference circuit.

With the negative- and positive-TC voltages obtained above, we can develop a reference voltage having a zero temperature coefficient. We can write $Vref=\alpha_1 V_{BE}+\alpha_2(V_T \ln n)$, where $V_T \ln n$ is the difference between the base-emitter voltages of bipolar transistors Q71 and Q72. FIG. 7 is a circuit diagram of an embodiment of a bandgap reference circuit. Amplifier 71 receives voltages $V_{o1}$ and $V_{o2}$, and the MOS transistors in amplifier 71 for receiving voltages $V_{o1}$ and $V_{o2}$ may have zero or near zero threshold voltage. Preferably, the amplifier 71 may be implemented as the ones shown in FIG. 2 and FIG. 3. In order to obtain approximate voltage at nodes N1 and N2, resistors R71 and R72 have the same resistance. In FIG. 7, the output voltage Vout can be expressed as:

$$V_{out} = V_{BEQ72} + \frac{V_T \ln n}{R73}(R73 + R72)$$
$$= V_{BEQ72} + (V_T \ln n)\left(1 + \frac{R72}{R73}\right)$$

At room temperature $$\frac{\partial V_{BE}}{\partial T} = -1.5 \, \text{mV}/°K,$$

and $$\frac{\partial V_T}{\partial T} = 0.087 \, \text{mV}/°K,$$

in order to eliminate the temperature coefficient effect for the voltage, the value of $$\ln n\left(1 + \frac{R72}{R73}\right)$$

is approximate to 17.2, the ratio of $$\frac{\partial V_{BE}}{\partial T} \text{ to } \frac{\partial V_T}{\partial T}.$$

Figure 8:
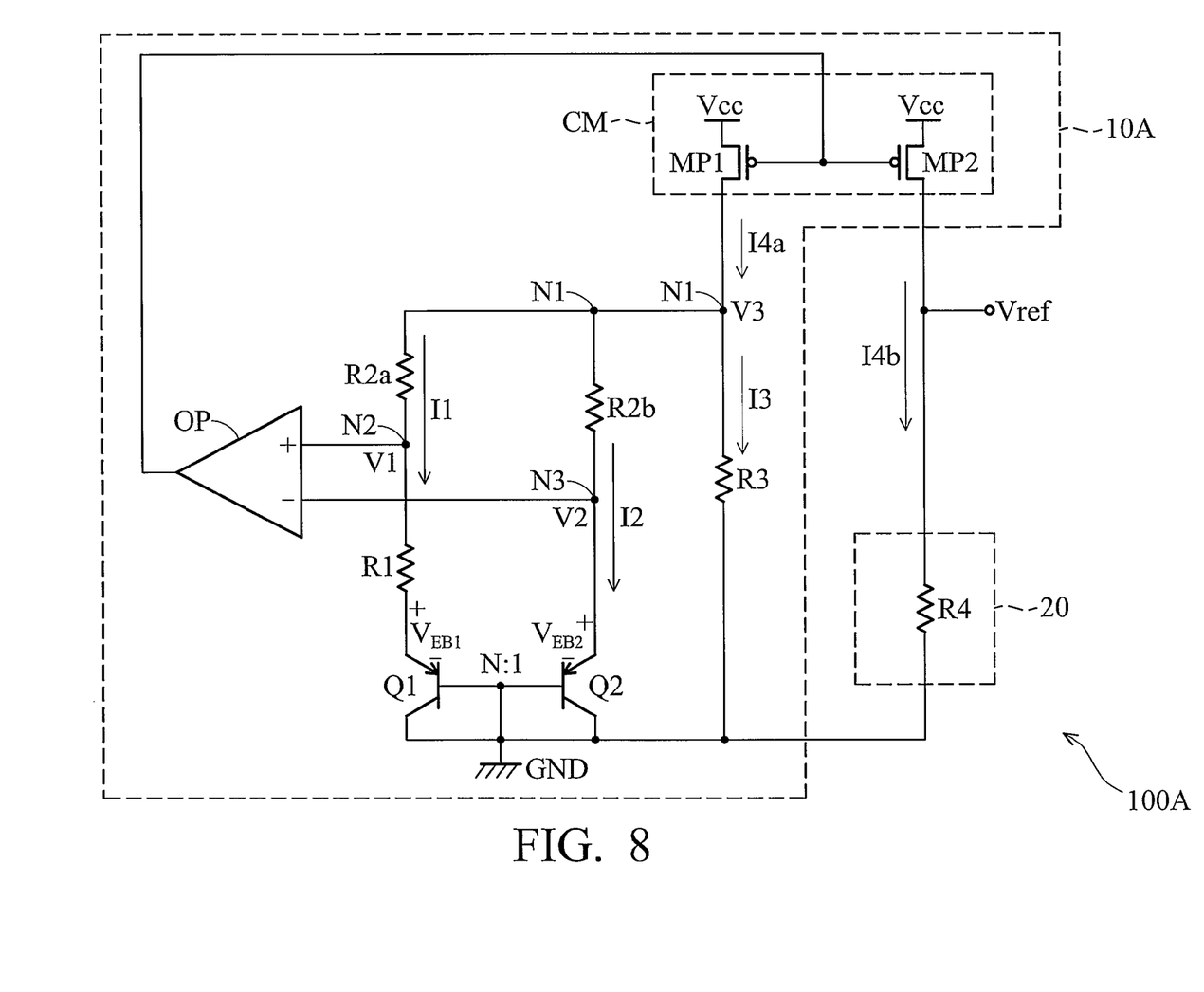
FIG. 8 is a circuit diagram of another embodiment of a bandgap reference circuit.

FIG. 8 shows an embodiment of a bandgap reference circuit. As shown, a bandgap reference circuit 100A comprises a current generation circuit 10A and a current-to-voltage generator 20. The current generation circuit 10A generates two identical output currents I4a and I4b, and the current I4b is obtained by combining currents I1, I2 and I3 since the currents I4a and I4b are identical. The current-to-voltage generator 20 generates an output voltage Vref according to the current I4b generated by the current generation circuit 10A.

The current generation circuit 10A comprises a current mirror CM, an operational amplifier OP, resistors R1, R2a, R2b and R3, and two bipolar transistors Q1 and Q2, in which the current mirror CM comprises two PMOS transistors MP1 and MP2 and the resistors R2a and R2b have the same resistance. In this embodiment, the transistors in the operational amplifier OP for receiving input voltages may have zero or near zero threshold voltage. For example, the transistors MP1 and MP2 have the same size, and the emitter area of the transistor Q1 can be N times that of the transistor Q2, in which N>1. The current-to-voltage generator 20 can be a resistor, a resistive element, a passive element or combinations thereof. In this case, the current-to-voltage generator 20 comprises a resistor R4.

The transistor MP1 comprises a first terminal coupled to a power voltage Vcc, a second terminal coupled to a node N1, and a control terminal coupled to the transistor MP2. The transistor MP2 comprises a first terminal coupled to the power voltage Vcc, a control terminal coupled to the control terminal of the transistor MP1 and a second terminal coupled to the resistor R4. The resistor R3 is coupled between the node N1 and a ground voltage GND, the resistor R2a is coupled between the nodes N1 and N2, the resistor R2b is coupled between the nodes N1 and N3, and the resistor R1 is coupled between the node N2 and the transistor Q1.

The operational amplifier comprises a first terminal coupled to the node N2 and a second terminal coupled to the node N3, and an output terminal coupled to the control terminals of the transistors MP1 and MP2 in the current mirror CM. The operational amplifier OP outputs a control signal to control the current mirror CM according to the voltages at the nodes N2 and N3.

The transistor Q1 comprises an emitter coupled to the resistor R1 and a collector coupled to the ground voltage GND and a base coupled to the transistor Q2. The transistor Q2 comprises an emitter coupled to the node N3 and a collector coupled to the ground voltage GND and a base coupled to the base of the transistor Q1. In this case, the bases of the transistor Q1 and Q2 are coupled to the ground voltage GND. Namely, the transistors Q1 and Q2 are diode-connected transistors.

If the base current is neglected, the emitter-base voltage $V_{EB}$ of a forward active operation diode can be expressed as:

$$V_{EB} = \frac{kT}{q} \ln\left(\frac{Ic}{Is}\right)$$

Wherein k is the Boltzmannis constant ($1.38 \times 10^{-23}$ J/K), q is the electronic charge ($1.6 \times 10^{-29}$ C), T is temperature, $I_C$ is the collector current, and $I_S$ is the saturation current.

When the input voltages V1 and V2 of the operational amplifier OP are matched and the size of the transistor Q1 is N times that of the transistor Q2, the emitter-base voltage difference between the transistors Q1 and Q2, $\Delta V_{EB}$, becomes:

$$\Delta V_{EB} = V_{EB2} - V_{EB1} = \frac{kT}{q} \ln N$$

Wherein $V_{EB1}$ is the emitter-base voltage of the transistor Q1, and $V_{EB2}$ is the emitter-base of the transistor Q2.

Because the input voltages V1 and V2 are matched by the operational amplifier OP, the voltages V1 and V2 can be expressed as:

$$V1 = V2 = V_{EB2} = V_{EB1} + I1 \times R1$$

$$I1 \times R1 = V_{EB2} - V_{EB1} = \frac{kT}{q} \ln N$$

Thus, the current I1 through the resistors R2a and R1 can be expressed as:

$$I1 = \frac{V_T}{R1} \ln N,$$

wherein thermal voltage is $$V_T = \frac{kT}{q}.$$

Because the resistors R2a and R2b are identical and the input voltages V1 and V2 are matched by the operational amplifier OP, the current I2 can be the same as the current I1.

Accordingly, $$I1 = I2 = \frac{V_T}{R1} \ln N,$$

since the thermal voltage $V_T$ has a positive temperature coefficient of 0.085 mV/° C., and the currents I1 and I2 have positive temperature coefficient.

Thus, voltage V3 at the node N1 can be expressed as:

$$V3 = I3 \times R3 = I1 \times (R1 + R2a) + V_{EB1} = I2 \times R2b + V_{EB2}$$

Hence, the current I3 can be expressed as:

$$I3 = \frac{1}{R3}\left[V_{EB2} + \left(\frac{V_T \ln N}{R1} \times R2b\right)\right]$$

Because the emitter-base voltage $V_{EB}$ of the transistors has a negative temperature coefficient of −2 mV/° C., the current I3 has a negative temperature coefficient.

As the transistors MP1 and MP2 in the current mirror CM are identical, the current I4b is the same as the current I4a, and can be expressed as:

$$I4a = I4b = I1 + I2 + I3 = 2I1 + I3 = \left(\frac{2}{R1} + \frac{R2b}{R1 \times R3}\right) \times V_T \ln N + \frac{V_{EB2}}{R3}$$

Hence, if a proper ratio of resistances of the resistors R1, R2a, R2b and R3 is selected, the current I4a will have a near zero temperature coefficient and low sensitivity to temperature. Namely, each current mirror output (currents I4a and I4b) of the current mirror CM will have a near zero temperature coefficient and low sensitivity to temperature.

Accordingly, the output voltage of the bandgap reference circuit 100A can be expressed as:

$$V_{ref} = I4b \times R4 = \left(\frac{2R4}{R1} + \frac{R2b \times R4}{R1 \times R3}\right) \times V_T \ln N + \frac{R4}{R3} \times V_{EB2}$$

Note that the resistors R2a and R2b prevent direct connection of the input terminal of the operational amplifier OP, ensuring normal operation of amplifier OP. Without the resistor R3, the output voltage Vref of the bandgap reference circuit is limited to 1.25V, which cannot be operated in low voltage environments, in order to obtain a near zero temperature coefficient. Thus, the invention utilizes the resistor R3 to induce the current I3 with negative temperature coefficient to overcome such limitation, and if a proper ratio of resistances of the resistors R1, R2a, R2b, R3 and R4 is selected, the output voltage Vref will have low sensitivity to temperature and can be operated in low voltage environments.

Figure 9:
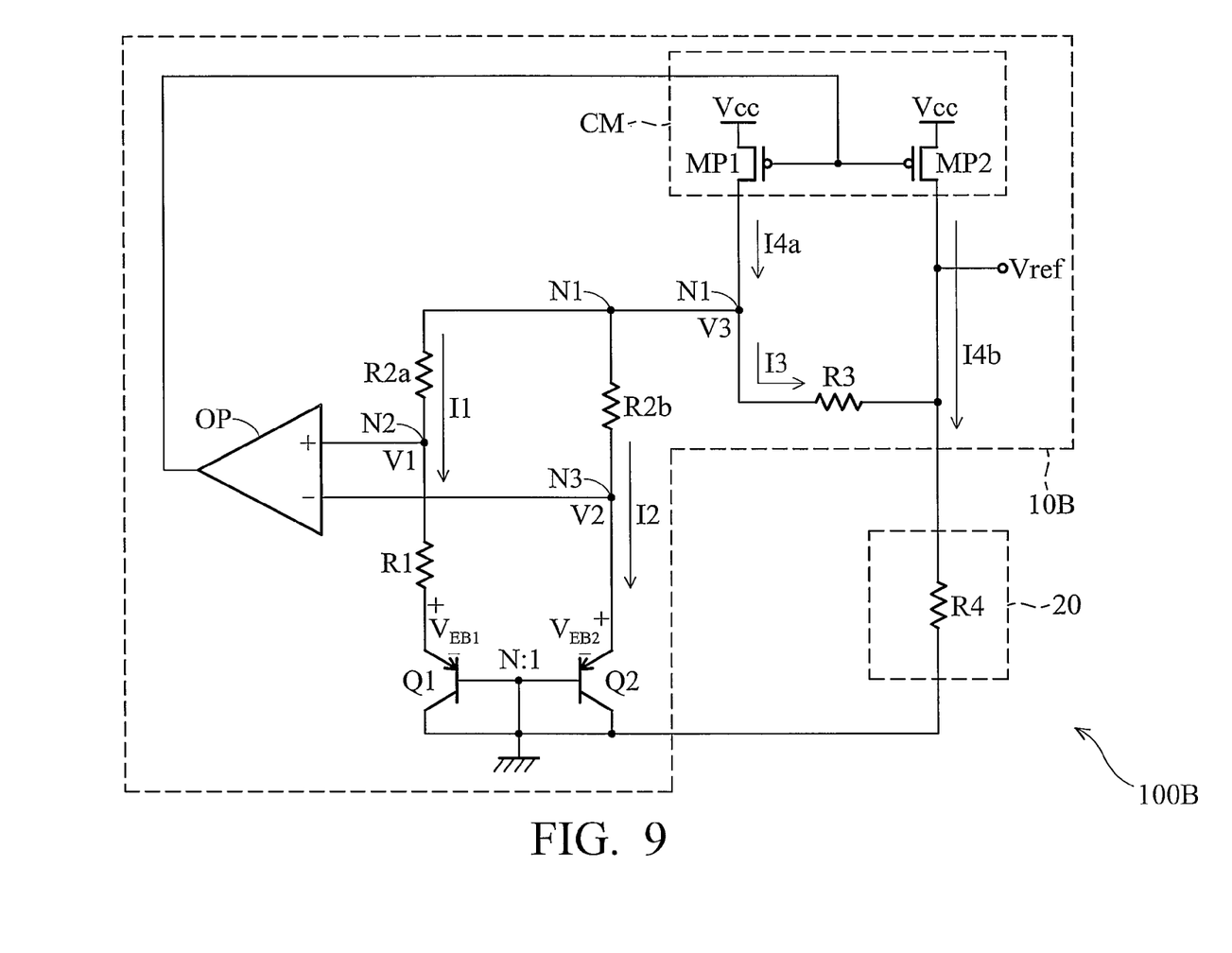
FIG. 9 is a circuit diagram of another embodiment of a bandgap reference circuit.

FIG. 9 shows another embodiment of a bandgap reference circuit. As shown, the bandgap reference circuit 100B is similar to the circuit 100A shown in FIG. 1 except for the resistor R3. The resistor R3 is coupled between the node N1 and the resistor R4 rather than the ground voltage GND. In this embodiment, the transistors in the operational amplifier OP for receiving input voltages may have zero or near zero threshold voltage.

Similarly, currents I1 and I2 are equal and can be expressed as:

$$I1 = I2 = \frac{V_T}{R1}\ln N$$

The voltage V3 at the node N1 and the output voltage Vref can be expressed as:

$$V3 = \frac{V_T \ln N}{R1} \times R2b + V_{EB2}$$

$$Vref = R4 \times \left[\left(\frac{V3-Vref}{R3}\right) + 2I2 + \left(\frac{V3-Vref}{R3}\right)\right] = R4 \times \left(\frac{2V3}{R3} - \frac{2Vref}{R3} + 2I2\right) = \frac{1}{\left(1+\frac{2R4}{R3}\right)}\left[\frac{R4}{R3}V_{EB2} + \left(\frac{2R2 \times R4}{R1 \times R3} + \frac{2R4}{R1}\right)V_T \ln N\right]$$

Because the emitter-base voltage $V_{EB}$ of transistors has a negative temperature coefficient of −2 mV/° C., the current I3 has a negative temperature coefficient. Hence, if a proper ratio of resistances of the resistors R1, R2a, R2b, R3 and R4 is selected, the output voltage Vref will have low sensitivity to temperature and can be operated in low voltage environments. Similarly, if a proper ratio of resistances of the resistors R1, R2a, R2b, R3 and R4 is selected, the output voltage Vref will have low sensitivity to temperature, the currents I4a and I4b can also have low sensitivity to temperature, and the description thereof is omitted for simplification.

The bandgap reference circuits 100A and 100B of the invention can act as a necessary functional block for the operation of mixed-mode and analog integrated circuits (ICs), such as data converters, phase lock-loop (PLL) circuits, oscillators, power management circuits, dynamic random access memory (DRAM), flash memory, and much more. For example, the bandgap reference circuit 100A may provide the current I4b or the output voltage Vref to a core circuit and the core circuit executes functions thereof accordingly.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An operational amplifier of a bandgap reference circuit, comprising:
   a first NMOS transistor having near zero threshold voltage, a first gate for receiving a first input signal of a pair of differential signals, a first source, and a first drain;
   a second NMOS transistor having near zero threshold voltage, a second gate for receiving a second input signal of the pair of differential signals, a second source, and a second drain;
   a third PMOS transistor having a third gate, a third source, and a third drain, wherein the third source is directly coupled to a high voltage source, and the third gate and the third drain are coupled to the first drain;
   a fourth PMOS transistor having a fourth gate, a fourth source, and a fourth drain, wherein the fourth source is directly coupled to the high voltage source, and the fourth gate is coupled to the first drain and the fourth drain is coupled to the second drain; and
   a fifth NMOS transistor having a fifth gate, a fifth source, and a fifth drain, wherein the fifth gate receives a bias voltage, the fifth drain is coupled to the first source and the second source, and the fifth source is directly grounded.

2. The amplifier as claimed in claim 1, wherein the first NMOS transistor comprises:
   a p-type substrate;
   a gate structure formed on the p-type substrate;
   a first n-type region directly doped in the p-type substrate; and
   a second n-type region directly doped in the p-type substrate, wherein the first n-type region and the second n-type region are symmetrical with respect to the gate structure.

3. The amplifier as claimed in claim 1, wherein the third PMOS transistor, the fourth PMOS transistor, and the fifth NMOS transistor also have near zero threshold voltage.

4. An operational amplifier of a bandgap reference circuit, comprising:
   a first PMOS transistor having near zero threshold voltage, a first gate for receiving a first input signal, a first source, and a first drain;
   a second PMOS transistor having near zero threshold voltage, a second gate for receiving a second input signal, a second source, and a second drain;
   a third NMOS transistor having a third gate, a third source, and a third drain, wherein the third source is directly grounded, the third gate and the third drain are coupled to the first drain;
   a fourth NMOS transistor having a fourth gate, a fourth source, and a fourth drain, wherein the fourth source is directly grounded, and the fourth gate is coupled to the first drain and the fourth drain is coupled to the second drain; and
   a fifth PMOS transistor having a fifth gate, a fifth source, and a fifth drain, wherein the fifth gate receives a bias voltage, the fifth drain is coupled to the first source and the second source, and the fifth source is directly coupled to a high voltage source.

5. The amplifier as claimed in claim 4, wherein the first PMOS transistor comprises:
   a n-type substrate;
   a gate structure formed on the n-type substrate;
   a first p-type region directly doped in the n-type substrate; and
   a second p-type region directly doped in the n-type substrate, wherein the first p-type region and the second p-type region are symmetrical with respect to the gate structure.

6. The amplifier as claimed in claim 4, wherein the third NMOS transistor, the fourth NMOS transistor, and the fifth PMOS transistor also have near zero threshold voltage.

* * * * *